United States Patent
Lu et al.

(10) Patent No.: US 11,614,693 B2
(45) Date of Patent: Mar. 28, 2023

(54) METHOD OF DETERMINING THE INITIAL CONTACT POINT FOR PARTIAL FIELDS AND METHOD OF SHAPING A SURFACE

(71) Applicant: CANON KABUSHIKI KAISHA, Tokyo (JP)

(72) Inventors: Xiaoming Lu, Cedar Park, TX (US); Logan L. Simpson, Coupland, TX (US); Mario Johannes Meissl, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/364,473

(22) Filed: Jun. 30, 2021

(65) Prior Publication Data

US 2023/0014261 A1   Jan. 19, 2023

(51) Int. Cl.
*G03F 7/20* (2006.01)

(52) U.S. Cl.
CPC ........ *G03F 7/7085* (2013.01); *G03F 7/70516* (2013.01); *G03F 7/70525* (2013.01); *G03F 7/705* (2013.01)

(58) Field of Classification Search
CPC ............... G03F 7/7085; G03F 7/70516; G03F 7/70525; G03F 7/705
See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,865,046 B2 | 10/2014 | Sreenivasan et al. | |
| 9,285,675 B2 | 3/2016 | Hamaya et al. | |
| 9,400,426 B2 | 7/2016 | Hamaya et al. | |
| 10,549,313 B2 | 2/2020 | Ye | |
| 10,578,964 B2 | 3/2020 | GanapathiSubramaniam et al. | |
| 2010/0096764 A1 | 4/2010 | Lu | |
| 2013/0113136 A1 | 5/2013 | Arai | |
| 2017/0165898 A1 | 5/2017 | Meissl et al. | |
| 2019/0101823 A1 | 4/2019 | Patel et al. | |
| 2020/0292933 A1 | 9/2020 | Rafferty et al. | |

*Primary Examiner* — Mesfin T Asfaw
(74) *Attorney, Agent, or Firm* — Daniel Ratoff

(57) ABSTRACT

A system and method for shaping a film on a partial field including determining an initial contact point. Receiving information about: a partial field of a substrate; and an edge of a patternable area of the substrate. Determining a chord that connects intersection vertices of the partial field and the edge. Determining coordinates of a bisecting line, wherein the bisecting line bisects the chord, and the bisecting line is orthogonal to the chord. Determining an initial contact point range on the bisecting line in which a template and formable material on the substrate contact each other. Contacting the formable material in the partial field on the substrate with the template at an initial contact point within the initial contact point range.

20 Claims, 15 Drawing Sheets

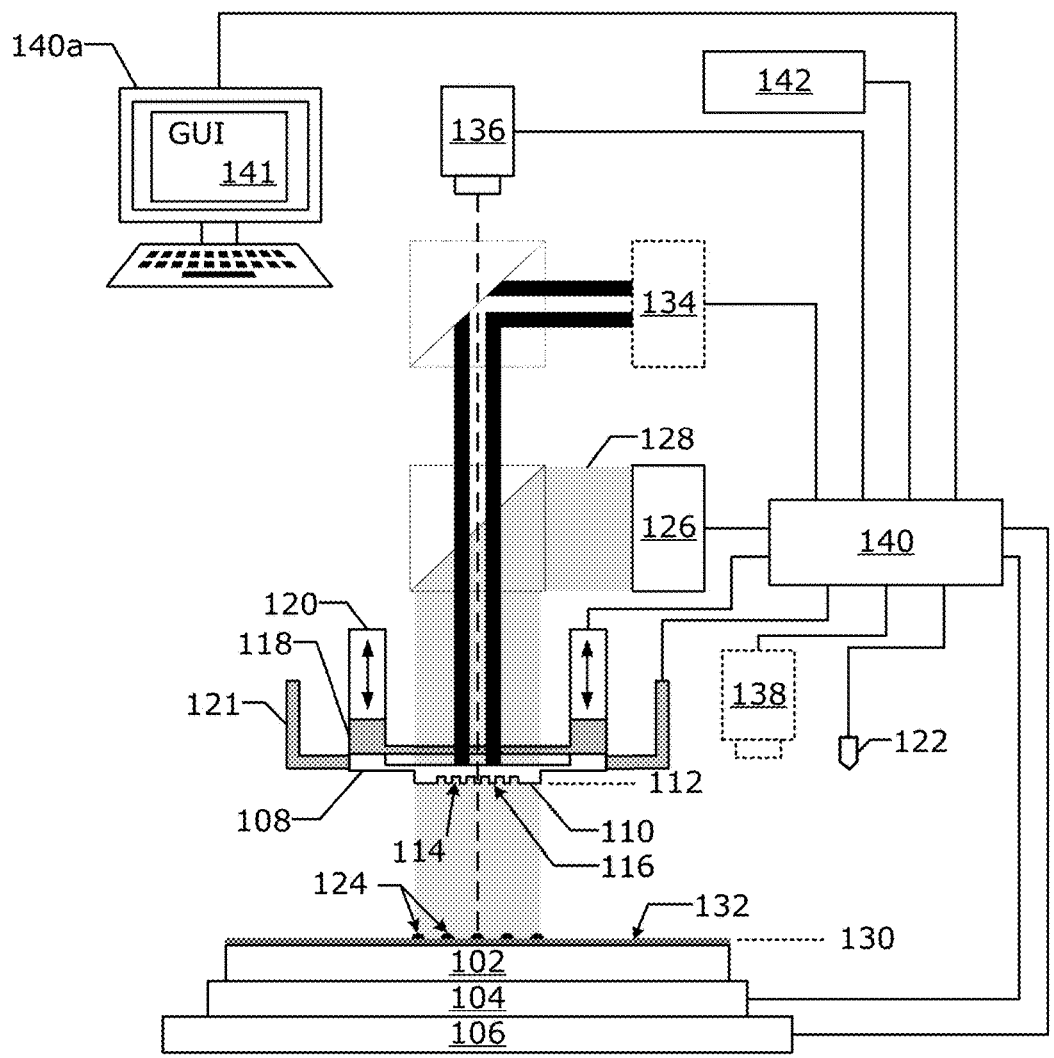
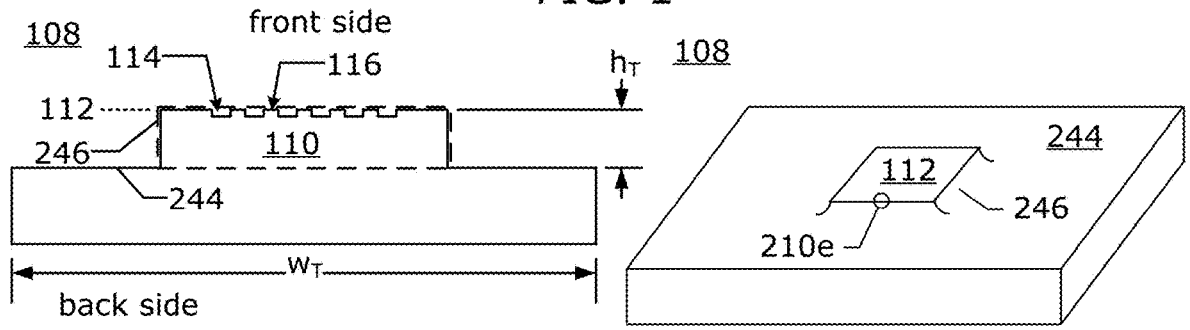
FIG. 1
FIG. 2A
FIG. 2B

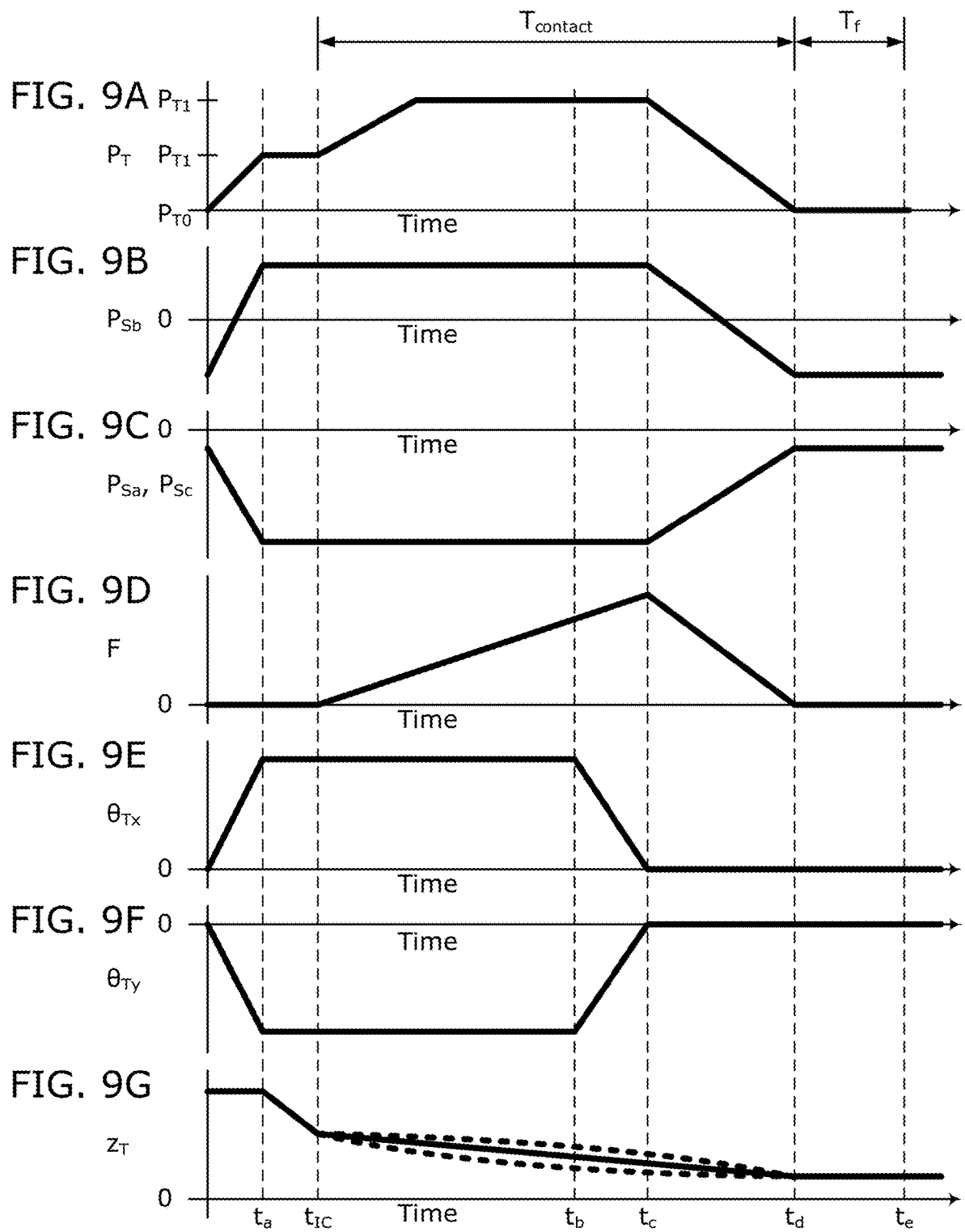

METHOD OF DETERMINING THE INITIAL CONTACT POINT FOR PARTIAL FIELDS AND METHOD OF SHAPING A SURFACE

BACKGROUND OF INVENTION

Technical Field

The present disclosure relates to photomechanical shaping systems (e.g., Nanoimprint Lithography and Inkjet Adaptive Planarization). In particular, the present disclosure relates to methods of determining a contact point and a novel method of contacting a substrate with a shaping surface.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid that may have been deposited as a drop pattern causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a method. The method may comprise receiving information about: a partial field of a substrate; and an edge of a patternable area of the substrate. The method may further comprise determining a chord that connects intersection vertices of the partial field and the edge. The method may further comprise determining coordinates of a bisecting line, wherein the bisecting line bisects the chord, and the bisecting line is orthogonal to the chord. The method may further comprise determining an initial contact point range on the bisecting line in which a template and formable material on the substrate contact each other. The method may further comprise contacting the formable material in the partial field on the substrate with the template at an initial contact point within the initial contact point range.

In an aspect of the first embodiment an area of the partial field may be less than 30% of a full field area of the substrate.

The first embodiment, may further comprise determining control conditions which allow the template to initially contact the formable material at the initial contact point.

In an aspect of the first embodiment the control conditions may include a pressure applied to a back surface of the template which bows out the template.

In an aspect of the first embodiment the control conditions may include a tilt of the template relative to the substrate.

In an aspect of the first embodiment the control conditions may include a set of control values supplied to a substrate chuck; wherein the substrate chuck deforms a shape of the substrate.

In an aspect of the first embodiment the edge of the patternable area may be inset from a substrate edge.

In an aspect of the first embodiment the substrate may be divided into a plurality of fields including a plurality of full fields and a plurality of partial fields. The plurality of partial fields may fall into multiple partial field categories. The first embodiment may further comprise determining an initial contact point for a particular partial field among the plurality of partial fields is based on the partial field category.

In an aspect of the first embodiment the partial field category may be based on a shape of the partial field.

The first embodiment may also be a method of shaping a film on a substrate in a plurality of fields. A subset of fields among the plurality of fields that are categorized as the partial field are shaped using the first embodiment. The method of shaping a film may further comprise adjusting, after the initial contact, the control conditions so that the template contacts all of the formable material in the particular field with the template. The method of shaping a film may further comprise exposing the formable material under the template to actinic radiation after the template and the substrate are substantially parallel to each other. The method of shaping a film may further comprise separating the template from the formable material.

The first embodiment may also be a method of manufacturing an article from a substrate on which a film was shaped. The first embodiment may further comprise processing the substrate. The first embodiment may further comprise forming the article from the processed device-yielding substrate.

The first embodiment may further comprise increasing a template back pressure that a template chuck uses to bow out the template after the initial contact.

In an aspect of the first embodiment the information received may include a layout of a plurality of fields.

A second embodiment, may be a system comprising: one or more memory; and one or more processors. The one or more processors may be configured to receive information about: a template; a partial field of a substrate; and an edge of a patternable area of the substrate. The one or more processors may be further configured to determine a chord that connects intersection vertices of the partial field and the edge. The one or more processors may be further configured to determine coordinates of a bisecting line, wherein the bisecting line bisects the chord, and the bisecting line is orthogonal to the chord. The one or more processors may be further configured to determine an initial contact point range on the bisecting line in which the template and formable material on the substrate contact each other. The one or more processors may be further configured to send instructions for a shaping system to contact the formable material in the partial field on the substrate with the template at an initial contact point within the initial contact point range.

In an aspect of the second embodiment the processor may be further configured to determine control conditions which allow the template to initially contact the formable material at the initial contact point.

The second embodiment, may further comprise a template chuck configured to apply a pressure to a back surface of the template which bows out the template. The control conditions may include the pressure.

The second embodiment, may further comprise a plurality of actuators configured to adjust a tilt of the template relative to the substrate. The control conditions may include the tilt.

The second embodiment, may further comprise a substrate chuck configured to deform a shape of the substrate. The control conditions may include a set of control values supplied to the substrate chuck.

In an aspect of the second embodiment the substrate is divided into a plurality of fields including a plurality of full fields and a plurality of partial fields. The plurality of partial fields falls into multiple partial field categories. The processor may be further configured to determine an initial contact point for a particular partial field among the plurality of partial fields based on the partial field category.

In an aspect of the second embodiment the partial field category is based on a shape of the partial field.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 1 is an illustration of an exemplary nanoimprint lithography system having a template with a mesa spaced apart from a substrate as used in an embodiment.

FIGS. 2A-B are illustrations of exemplary templates that may be used in an embodiment.

FIGS. 9A-G are timing diagrams that illustrate the control parameters of the shaping system as used in an embodiment.

Figure 3:
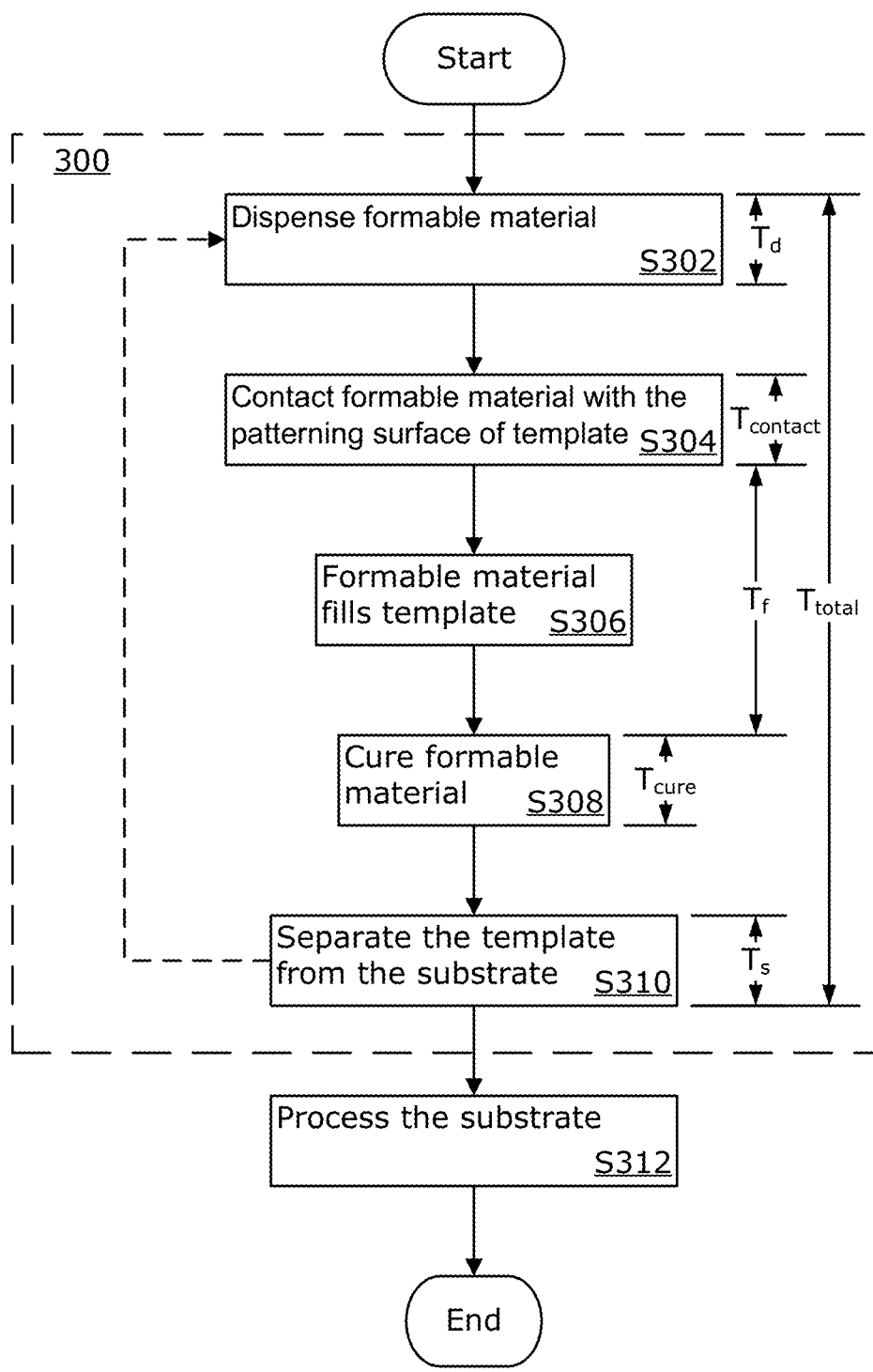
FIG. 3 is a flowchart illustrating an exemplary imprinting method as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprint lithography technique can be used in a step and repeat manner to shape a film with a template in a plurality of fields across a substrate. The substrate and a patterning area (mesa) of a template may have different shapes and sizes. For example, the substrate may have a region to be patterned that is circular, elliptical, polygonal, or some other shape. While the mesa is typically smaller than the substrate and has a different shape then the substrate. The substrate is divided into a plurality of full fields and a plurality of partial fields. The full fields are the same size as the mesa. The partial fields are those fields on the edge of the substrate in which the edge of the region to be patterned on the substrate intersects with the patterning are of the mesa. These fields may be divided into multiple categories based on their shape and/or area relative to the full field.

The partial fields tend to have higher defectivity and/or higher processing time then full fields. In addition, small partial fields which have an area less than 30% of a full field are particularly challenging. What is needed is a way to lower defectivity and/or higher processing time for small partial fields.

Shaping System

FIG. 1 is an illustration of a shaping system 100 (for example a nanoimprint lithography system or inkjet adaptive planarization system) in which an embodiment may be implemented. The shaping system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the positional axes x, y, and z, and rotational axes $\theta$, $\Psi$, and $\varphi$. The substrate positioning stage 106, the substrate 102, and the substrate chuck 104 may also be positioned on a base (not shown). The substrate positioning stage may be a part of a positioning system. In an alternative embodiment, the substrate chuck 104 may be attached to the base.

Spaced-apart from the substrate 102 is a template 108 (also referred to as a superstrate). The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a patterning surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mesa 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include a template magnification control system 121. The template magnification control system 121 may include piezoelectric actuators (or other actuators) which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to a shaping head 120 which is a part of the positioning system. The shaping head 120 may be moveably coupled to a bridge. The shaping head 120 may include one or more actuators such as voice coil motors, piezoelectric motors, linear motor, nut and screw motor, etc., which are configured to move the template chuck 118 relative to the substrate in at least the z-axis direction, and potentially other directions (e.g., positional axes x, and y, and rotational axes θ, Ψ, and φ).

The shaping system 100 may further comprise a fluid dispenser 122. The fluid dispenser 122 may also be moveably coupled to the bridge. In an embodiment, the fluid dispenser 122 and the shaping head 120 share one or more or all of the positioning components. In an alternative embodiment, the fluid dispenser 122 and the shaping head 120 move independently from each other. The fluid dispenser 122 may be used to deposit liquid formable material 124 (e.g., polymerizable material) onto the substrate 102 in a drop pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the shaping surface 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The shaping system 100 may further comprise a curing system that induces a phase change in the liquid formable material into a solid material whose top surface is determined by the shape of the shaping surface 112. The curing system may include at least a radiation source 126 that directs actinic energy along an exposure path 128. The shaping head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. In an embodiment, the actinic energy may be directed through both the template chuck 118 and the template 108 into the formable material 124 under the template 108. In an embodiment, the actinic energy produced by the radiation source 126 is UV light that induces polymerization of monomers in the formable material 124.

The shaping system 100 may further comprise a field camera 136 that is positioned to view the spread of formable material 124 after the template 108 has contacted the formable material 124. FIG. 1 illustrates an optical axis of the field camera's imaging field as a dashed line. As illustrated in FIG. 1 the shaping system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of: a CCD; a sensor array; a line camera; and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting (shaping) process. The field camera 136 may also be configured to measure interference fringes, which change as the formable material spreads 124 between the gap between the shaping surface 112 and the substrate surface 130.

The shaping system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, optical diaphragms, apertures, filters, prisms, polarizers, windows, adaptive optics, and/or light sources. The droplet inspection system 138 may be positioned to inspect droplets prior to the shaping surface 112 contacting the formable material 124 on the substrate 102. In an alternative embodiment, the field camera 136 may be configured as a droplet inspection system 138 and used prior to the shaping surface 112 contacting the formable material 124.

The shaping system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a SLM such as a digital micromirror device (DMD), Liquid Crystal on Silicon (LCoS), Liquid Crystal Device (LCD), etc., to modulate the spatio-temporal distribution of thermal radiation. The shaping system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, drop dispense, slot dispense, etc. In an embodiment, the substrate 102 may be a semiconductor wafer. In another embodiment, the substrate 102 may be a blank template (replica blank) that may be used to create a daughter template after being imprinted.

The shaping system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The shaping system 100 may be regulated, controlled, and/or directed by one or more processors 140 (controller) in communication with one or more components and/or subsystems such as the substrate chuck 104, the substrate positioning stage 106, the template chuck 118, the shaping head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. The controller 140 may include a plurality of processors that are both included in the shaping system 100a and in communication with the shaping system 100a. The processor 140 may be in communication with a networked computer 140a on which analysis is performed and control files such as a drop pattern are generated. In an embodiment, there are one or more graphical user interface (GUI) 141 on one or both of the networked computer 140a and a display in communication with the processor 140 which are presented to an operator and/or user.

Either the shaping head 120, the substrate positioning stage 106, or both varies a distance between the mold 110 and the substrate 102 to define a desired space (a bounded physical extent in three dimensions) that is filled with the formable material 124. For example, the shaping head 120 may apply a force to the template 108 such that mold 110 is in contact with the formable material 124. After the desired volume is filled with the formable material 124, the radiation source 126 produces actinic radiation (e.g., UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the shaping system 100 uses a shaping process to form the patterned layer which has recesses and protrusions which are an inverse of the pattern in the shaping surface 112. In an alternative embodiment, the shaping system 100 uses a shaping process to form a planar layer with a featureless shaping surface 112.

The shaping process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

FIG. 2A is an illustration of a template 108 (not to scale) that may be used in an embodiment. The shaping surface 112 may be on a mesa 110 (identified by the dashed box in FIG. 2A). The mesa 110 is surrounded by a recessed surface 244 on the front side of the template. The mesa 110 has a mesa height $h_T$. The mesa height $h_T$ may between 1-200 μm. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners. In an embodiment, the mesa sidewalls 246 may have one or more of a perpendicular profile; an angled profile; a curved profile; a staircase profile; a sigmoid profile; a convex profile; or a profile that is combination of those profiles. FIG. 2B is a perspective view of the template 108 (not to scale) showing the mesa edges 210e. FIG. 2B illustrate that the intersection of the mesa sidewalls 246 and the recessed surface 244 may have some curvature due to the process of etching away material form a template precursor to form the mesa 110 on the template 108. The template 108 may have a square planar shape with a template width $w_T$ as illustrated in FIGS. 2A-B. In an alternative embodiment, the template width $w_T$ is a characteristic width and a planar shape of the template 108 may be a rectangle, parallelogram, polygon, or circle, or some other shape. The template width $w_T$ may be between 10-200 mm.

Shaping Process

FIG. 3 is a flowchart of a method of manufacturing an article (device) that includes a shaping process 300 performed by the shaping system 100. The shaping process 300 can be used to form patterns in formable material 124 on one or more imprint fields (also referred to as: pattern areas or shot areas). The shaping process 300 may be performed repeatedly on a plurality of substrates 102 by the shaping system 100. The processor 140 may be used to control the shaping process 300.

In an alternative embodiment, the shaping process 300 is used to planarize the substrate 102. In which case, the shaping surface 112 is featureless and may also be the same size or larger than the substrate 102.

The beginning of the shaping process 300 may include a template mounting step causing a template conveyance mechanism to mount a template 108 onto the template chuck 118. The shaping process 300 may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the shaping system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by a shaping field index i. In which N is the number of shaping fields and is a real positive integer such as 1, 10, 62, 75, 84, 100, etc. $\{N \in \mathbb{Z}^+\}$. In a dispensing step S302, the processor 140 may cause the fluid dispenser 122 to dispense formable material based on a drop pattern onto an imprinting field. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field may be moved relative to the fluid dispenser 122 while the fluid dispenser is ejecting formable material 124. Thus, the time at which some of the droplets land on the substrate may vary across the imprint field i. The dispensing step S302 may be performed during a dispensing period Td for each imprint field i.

In an embodiment, during the dispensing step S302, the formable material 124 is dispensed onto the substrate 102 in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in a particular imprint field. The contacting step S304 may be performed during a contacting period $T_{contact}$ which starts after the dispensing period $T_d$ and begins with the initial contact of the shaping surface 112 with the formable material 124. In an embodiment, at the beginning of the contact period $T_{contact}$ the template chuck 118 is configured to bow out the template 108 so that only a portion of the shaping surface 112 is in contact with a portion of the formable material. In an embodiment, the contact period $T_{contact}$ ends when the template 108 is no longer bowed out by the template chuck 118. The degree to which the shaping surface 112 is bowed out relative to the substrate surface 130 may be estimated with the spread camera 136. The spread camera 136 may be configured to record interference fringes due to reflectance from at least the shaping surface 112 and the substrate surface 130. The greater the distance between neighboring interference fringes, the larger the degree to which the shaping surface 112 is bowed out.

During a filling step S306, the formable material 124 spreads out towards the edge of the imprint field and the mesa sidewalls 246. The edge of the imprint field may be defined by the mesa sidewalls 246. How the formable material 124 spreads and fills the mesa may be observed via the field camera 136 and may be used to track a progress of a fluid front of formable material. In an embodiment, the filling step S306 occurs during a filling period $T_f$. The filling period $T_f$ begins when the contacting step S304 ends. The filling period $T_f$ ends with the start of a curing period $T_c$. In an embodiment, during the filling period $T_f$ the back pressure and the force applied to the template are held substantially constant. Substantially constant in the present context means that the back pressure variation and the force variation is within the control tolerances of the shaping system 100 which may be less 0.1% of the set point values.

In a curing step S308, the processor 140 may send instructions to the radiation source 126 to send a curing illumination pattern of actinic radiation through the template 108, the mesa 110, and the shaping surface 112 during a curing period $T_c$. The curing illumination pattern provides enough energy to cure (polymerize) the formable material 124 under the shaping surface 112. The curing period $T_c$ is a period in which the formable material under the template receives actinic radiation with an intensity that is high enough to solidify (cure) the formable material. In an alternative embodiment, the formable material 124 is exposed to a gelling illumination pattern of actinic radiation before the curing period $T_c$ which does not cure the formable material but does increase the viscosity of the formable material.

In a separation step S310, the processor 140 uses one or more of: the substrate chuck 104; the substrate positioning stage 106, template chuck 118, and the shaping head 120 to separate the shaping surface 112 of the template 108 from the cured formable material on the substrate 102 during a separation period $T_s$. If there are additional imprint fields to be imprinted, then the process moves back to step S302. In an alternative embodiment, during step S302 two or more imprint fields receive formable material 124 and the process moves back to steps S302 or S304.

In an embodiment, after the shaping process 300 is finished additional semiconductor manufacturing processing is performed on the substrate 102 in a processing step S312 so as to create an article of manufacture (e.g., semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, mounting, circuit board assembly, and the like. The substrate 102 may be processed to produce a plurality of articles (devices).

Layout of Fields on Substrate

Figure 4A:
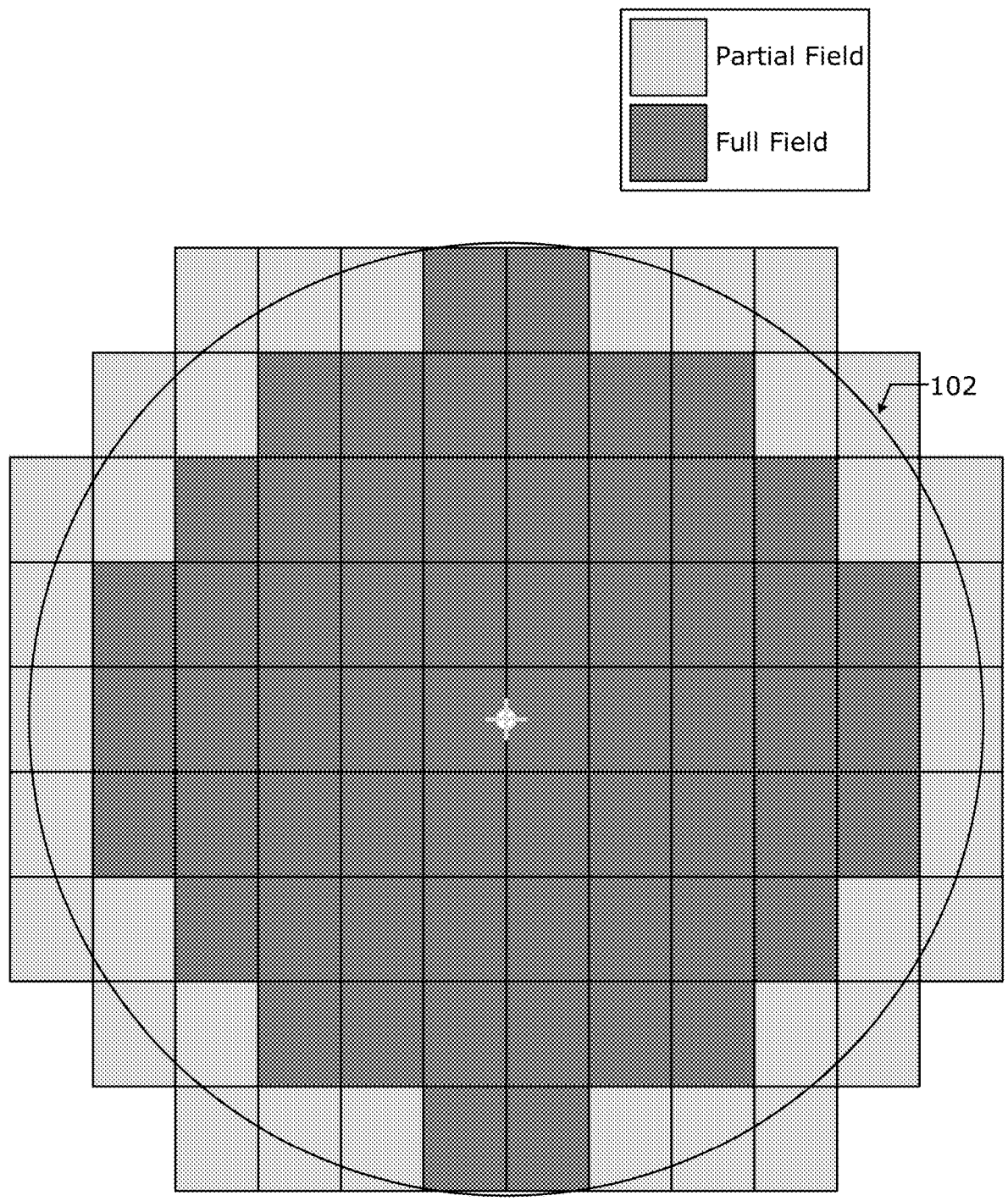
FIGS. 4A-B are illustrations of layouts of fields on substrates as used in an embodiment.
Figure 4B:
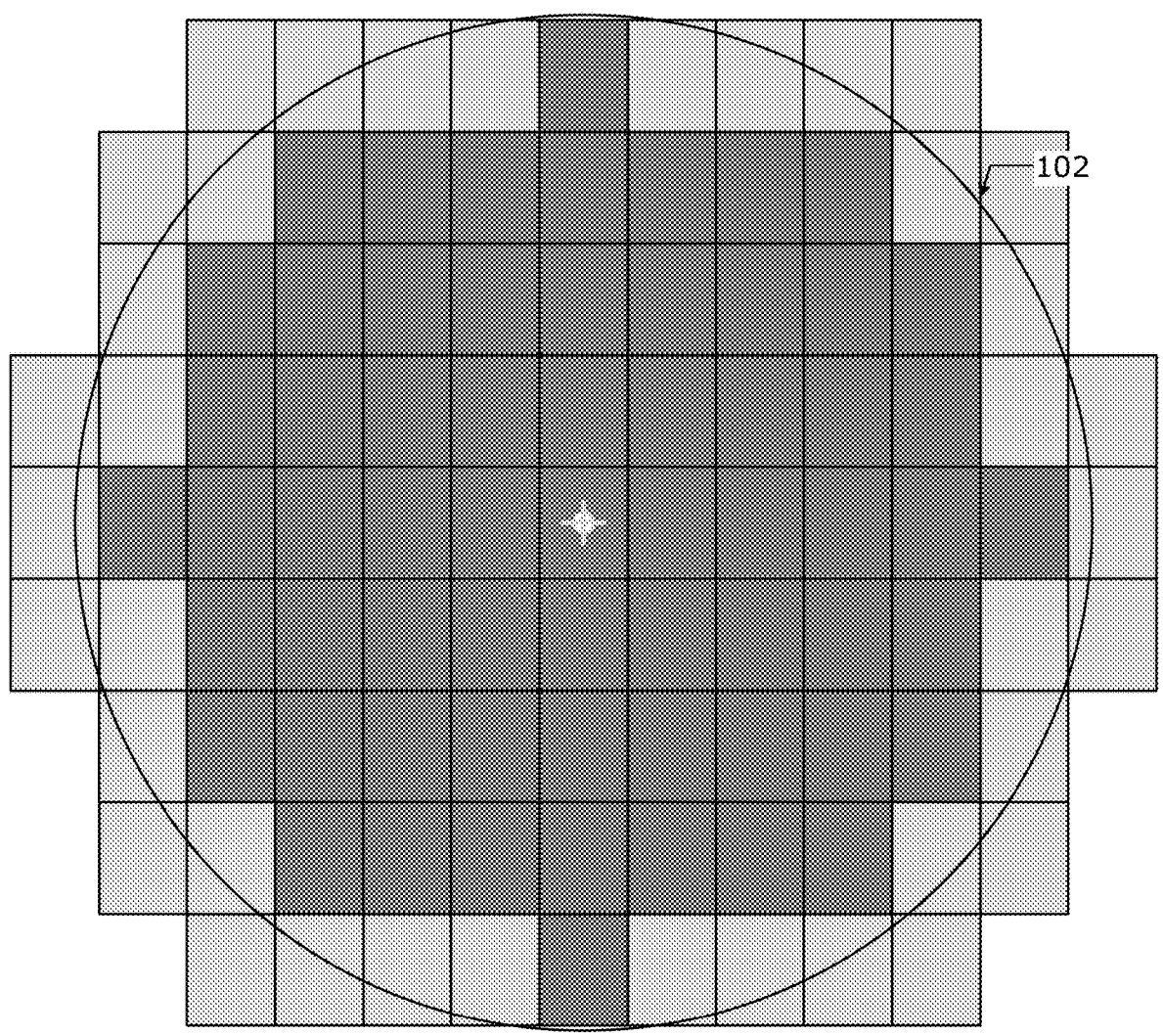

The shaping process 300 can be used in a step and repeat manner to shape a film with a template 108 in a plurality of fields across the substrate 102. The substrate 102 and a patterning area (mesa 110) of a template 108 may have different shapes and sizes. For example, the substrate 102 may have a region to be patterned that is circular, elliptical, polygonal, or some other shape. While the mesa 110 is typically smaller than the substrate 102 and has a different shape then the substrate 102. The substrate 102 is divided into a plurality of full fields and a plurality of partial fields as illustrated in FIGS. 4A-B. The full fields are the same size as the mesa 110. The partial fields are those fields on the edge of the substrate in which the edge of the region to be patterned on the substrate intersects with the patterning area of the mesa. These fields may be divided into multiple categories based on their shape and/or area relative to the full field. A subset of those partial fields maybe categorized as small partial fields.

Small Partial Fields

Figure 4C:
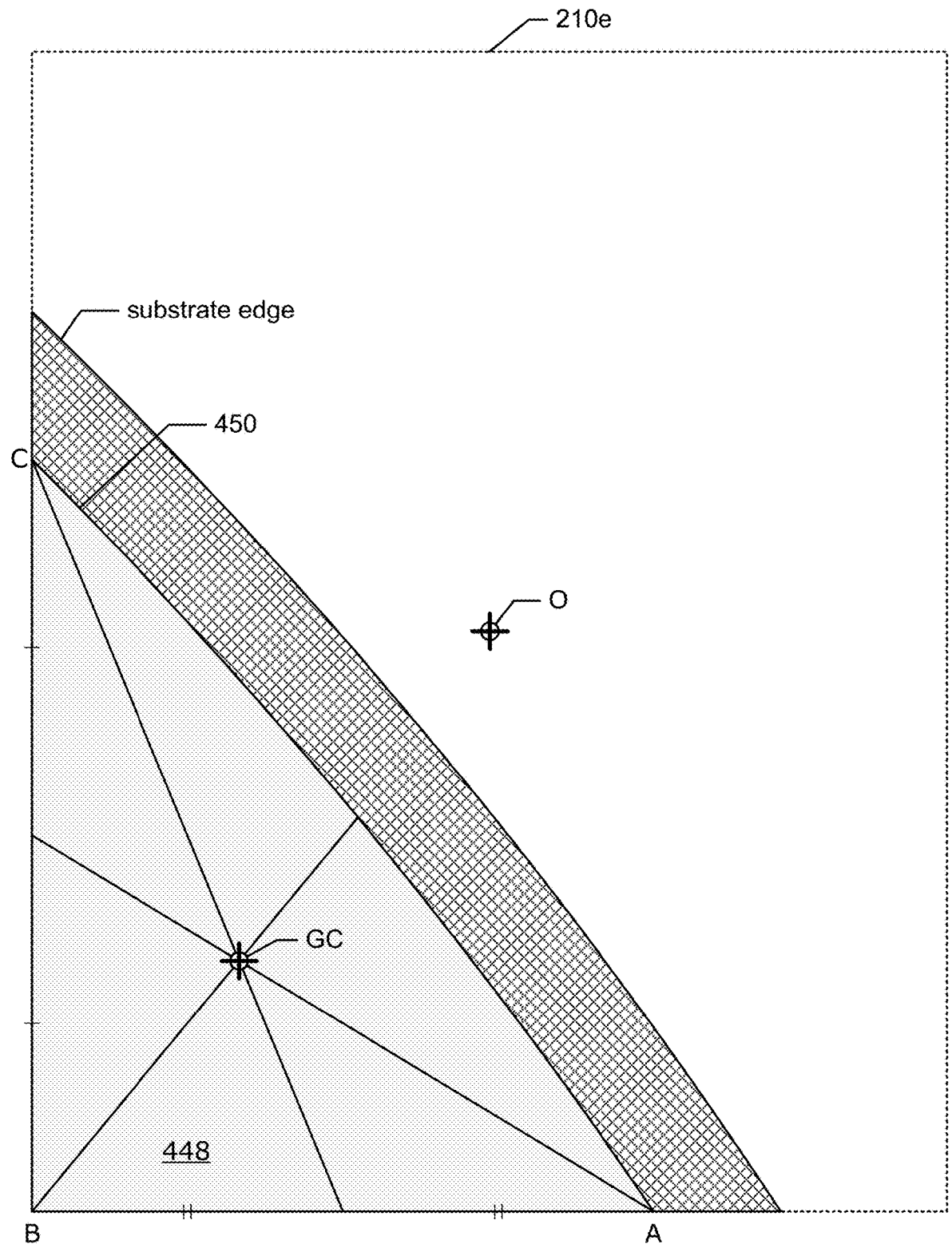
FIG. 4C is an illustration of a small partial field on substrate as used in an embodiment.

FIG. 4C is an illustration of a small partial field 448 on a substrate 102 in the coordinate system of the mesa 110. In FIG. 4C the mesa edges 210*e* are illustrated as dotted lines. FIG. 4C also shows the origin O of the coordinate system of the mesa which is at the center of the mesa 110. A patternable area edge 450 is shown inset from the substrate edge. In an embodiment, the patternable area edge 450 may be inset from the substrate edge by between 0 to 3 mm. The non-patterned area is illustrated with a diamond gird pattern in FIG. 4C. The width of the non-patterned area may be determined by an edge treatment of the substrate 102 which may have been treated to have rounded, bevelled, or chamfered edges. The substrate 102 may also have undergone numerous previous processes which cause the edge to have a random unpredictable pattern. The substrate 102 may also have an orientation feature such as a notch or flat edge.

As illustrated in FIG. 4C the extent of the small partial field 448 is defined on two sides by the mesa edge 210*e* which intersect at a vertex B. The extent of the small partial field 448 is also defined by the arc of the patternable area edge 450. The arc of the patternable area edge 450 may be defined as a portion of a circle, an ellipse, a spline, a polygon, or other geometric quantity that can be used to define a shape of the patternable area edge 450. The arc of the patternable area edge 450 intersects the mesa edges 210*e* at vertices A and C.

Initial Contact Point

The shaping process 300 is controlled using numerous parameters. In an embodiment, one of the process parameters used during the contacting step S302 is the initial contact point (ICP) for each field. The ICP is the point in the field in which the template 108 is brought into initial contact with formable material 124 on the substrate 102. The template 108 is bowed out by the template chuck 118 so that only a small portion of the template 108 is brought into contact with the formable material 124 at the ICP. The bowing of the template is reduced as the template is brought closer to the substrate, until the template is flat, this is done to allow gas to escape during the contacting step S304.

For full fields, the ICP is at the center of the full field. While the ICP is a single point the actual initial contact area is a larger area which may have an area of for example of 1 to 2 mm$^2$ when 0.1 N of imprint force is detected during the initial contact. For partial fields, determining the ICP is more complicated which depends on the shape and area of the partial field. For large partial fields (90% to 99% of the full field) the ICP may be at the same point as the full field or somewhere within the initial contact area. For medium size partial fields, the initial contact point may be determined by calculating a geometric center (GC) or a centroid of the partial field. There are several methods that may be used for determining the GC. One method of estimating the GC is to use a method of intersecting meridians as illustrated in FIG. 4C. Another method is to approximate the edge of the partial field using a function. The function may be defined in a piecewise manner and be continuous over the partial field. Integration may then be used to estimate a geometric center of the partial field. A third method of identifying the GC is to minimize distances from the GC to the farthest corners of the partial field.

The applicant has found that the GC works well for large and medium size fields; but it does not work as well for small partial fields. In an embodiment a partial field may be categorized as a small partial field 448 if it has 2 straight edges and one curved edge. In an embodiment a partial field may be categorized as a small partial field 448 if it has an area that is less than 30% of a full field. What is needed is a better method of determining the ICP for these small partial fields 448. In an embodiment a partial field may be categorized as a small partial field 448 if it has 3 straight edges and one curved edge and the area of the partial field is less than half of the full field. In an embodiment, the ICP is not the GC for small partial fields and the ICP is the GC for all partial fields that are not categorized as small partial fields.

Method of Determining ICP for Small Partial Fields

Figure 5:
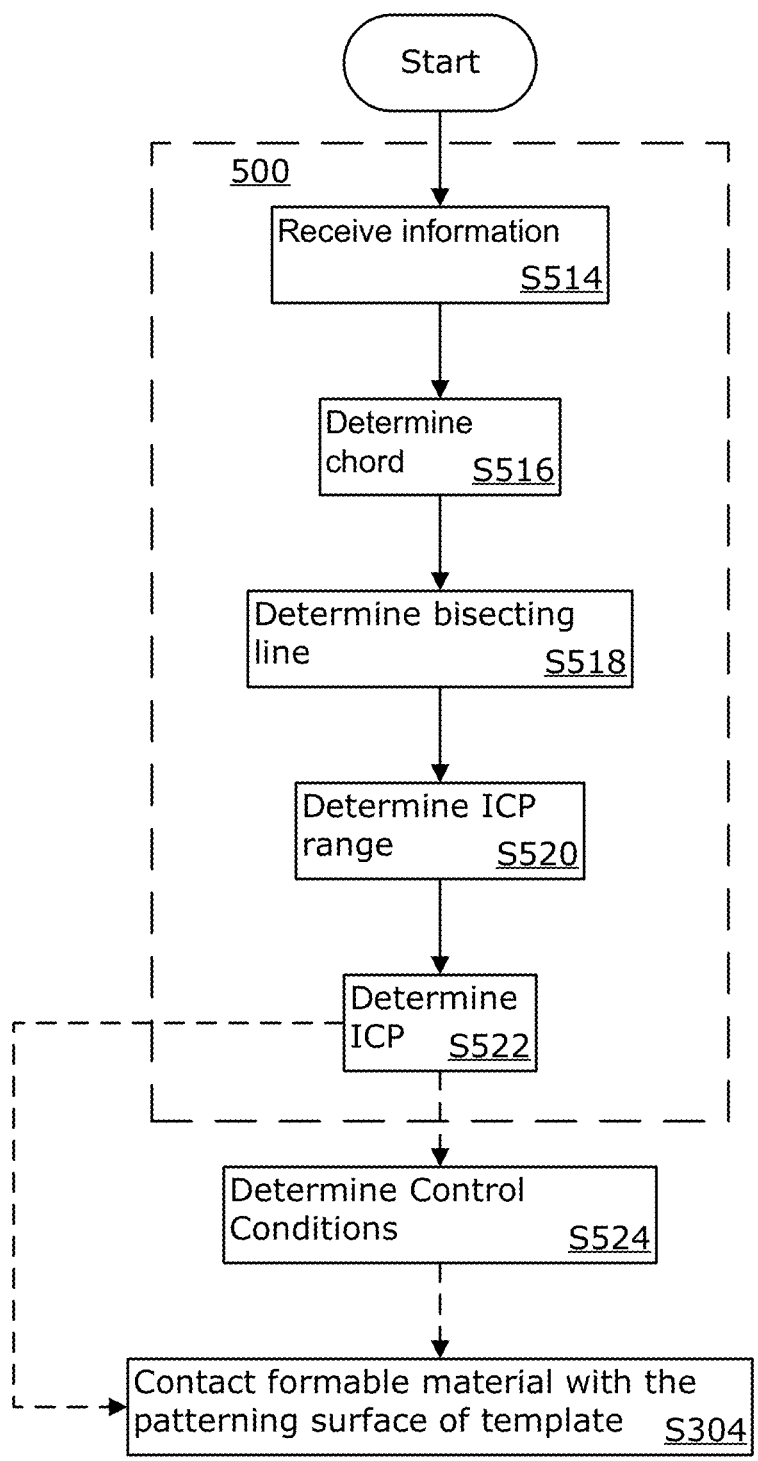
FIG. 5 is a flowchart illustrating a method of determining ICP for small partial fields as used in an embodiment.
Figure 6A:
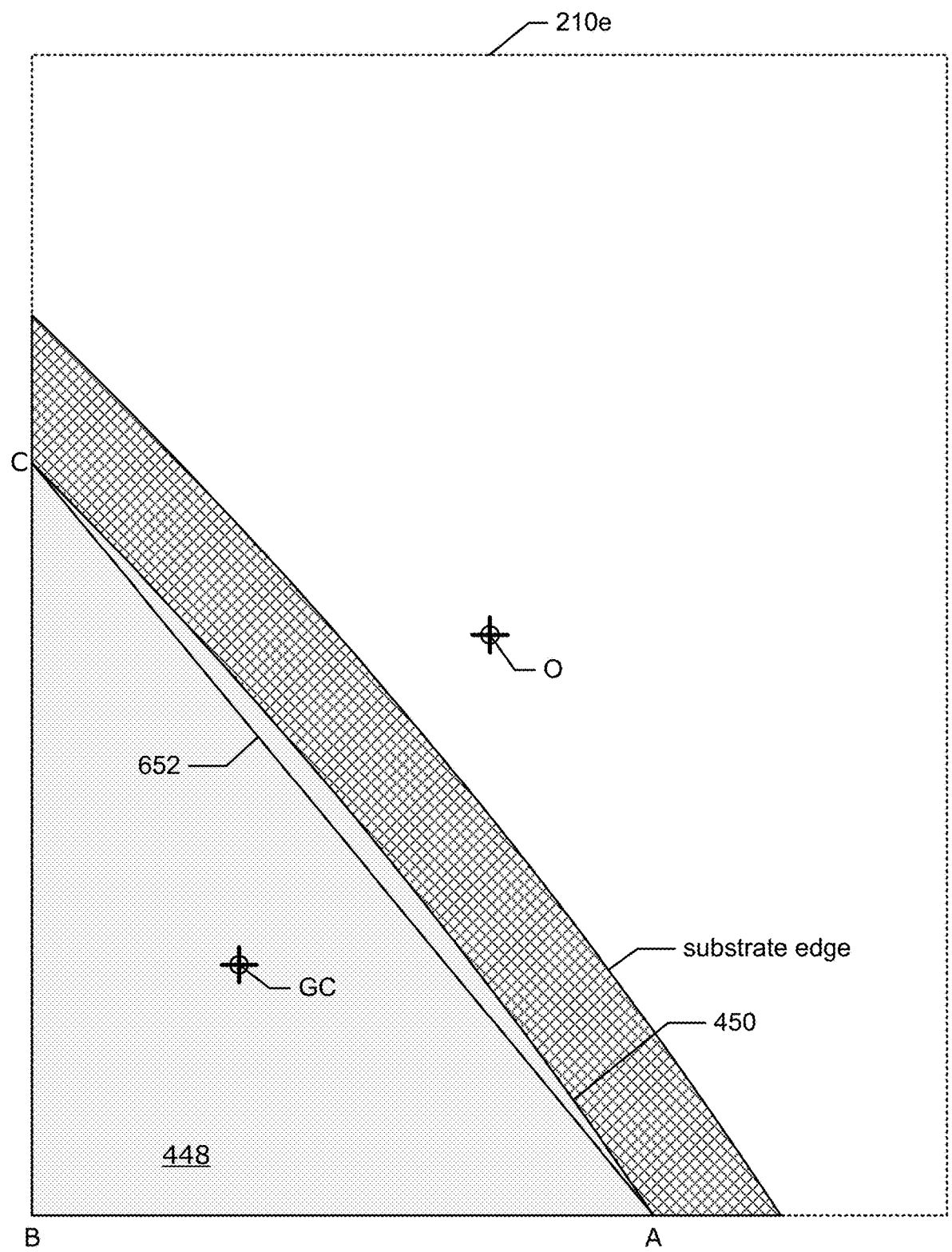
FIGS. 6A-D are illustrations of a small partial field on substrate as used in an embodiment.

FIG. 5 is flowchart of an ICP determination process 500 for small partial fields 448. The process 500 may include a receiving step S514 in which a processor receives layout information. The layout information may include: information about a template; information about a particular small partial field 448; and information about the patternable area edge 450. The process 500 may include a chord determination step S516 in which a chord 452 (as shown in FIG. 6A) that connects intersection vertices (A and C) of the small partial field 448 and the patternable area edge 450 is determined. The chord 652 is a straight line that connects two vertices (A and B) in which the mesa edge 210e intersects with the patternable area edge 450 when the template 108 is unbowed.

Figure 6B:
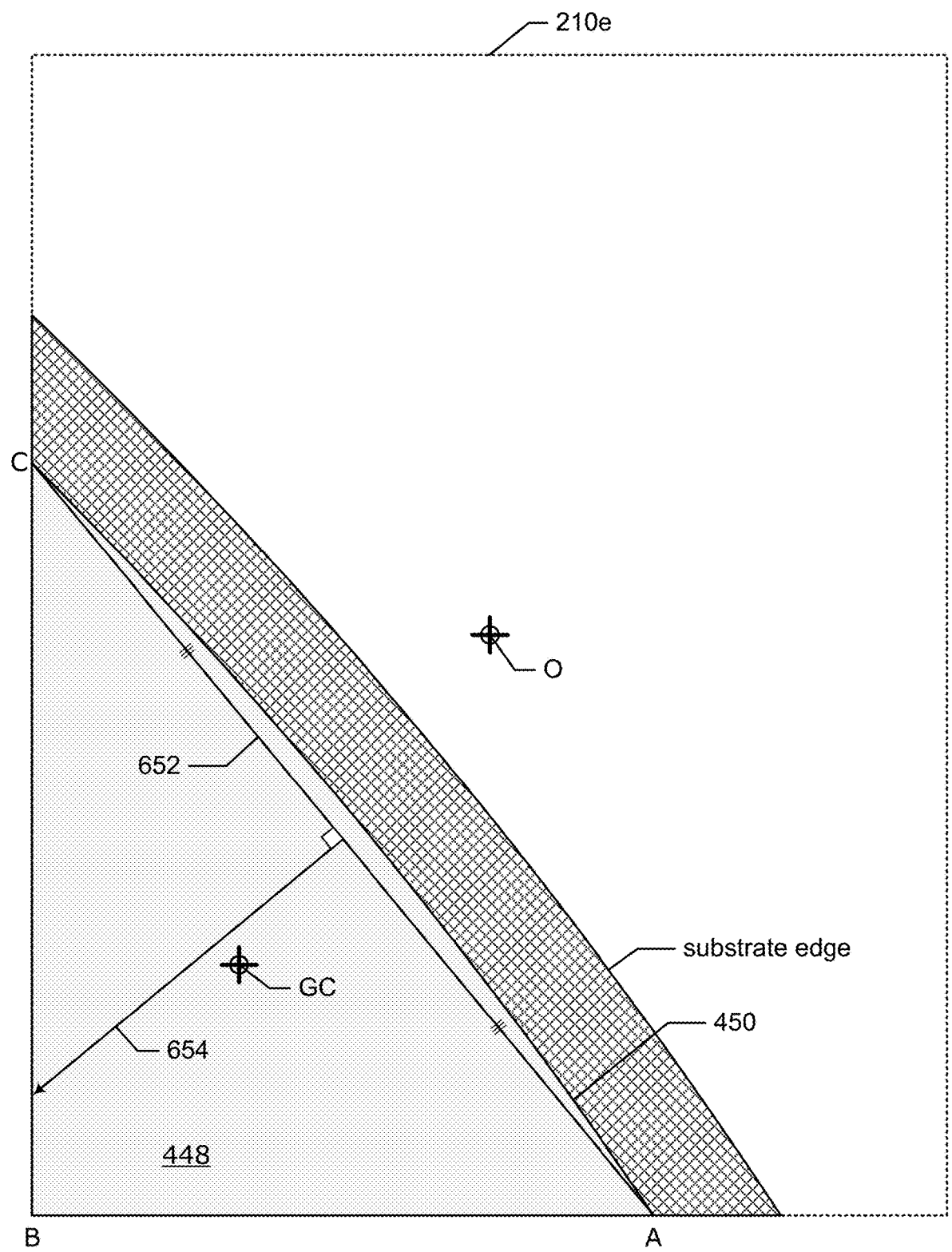

The process 500 may include a bisecting line determination step S518 in which an orthogonal bisecting line 654 is determined as illustrated in FIG. 6B. The orthogonal bisecting line 654 is orthogonal to the chord 652 and bisects the chord 652 into two equal pieces.

Figure 6C:
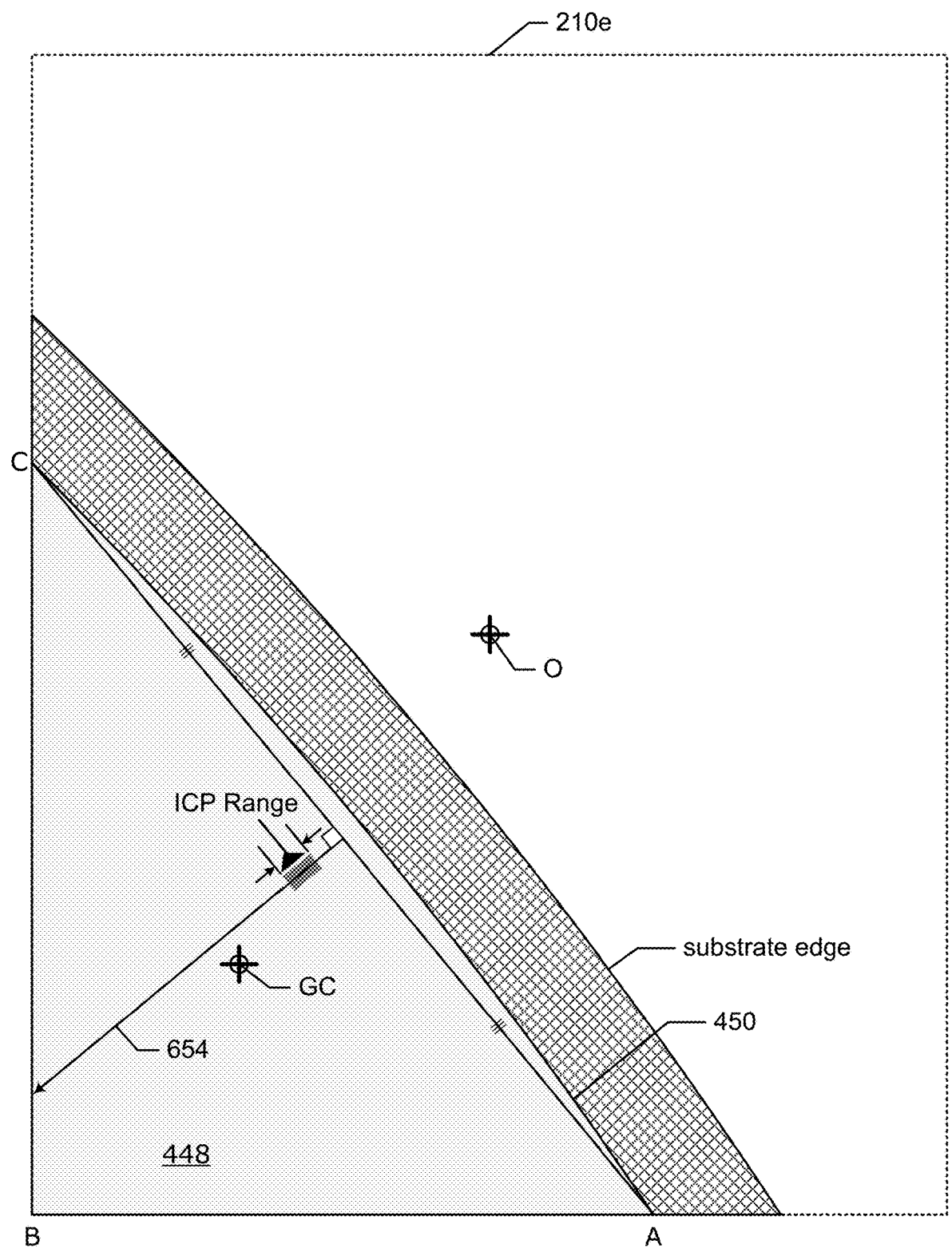

The process 500 may include an ICP range determination step S520 in which an ICP range on the orthogonal bisecting line 654 as illustrated in FIG. 6C. In an embodiment, the ICP range may have a width of 1, 3, or 5 mm. In an embodiment, the ICP range may have a width that is an 8-40% of a length of the orthogonal bisecting line 654 in the small partial field 448. The ICP range is inset from the patternable area edge 450 by 1-5 mm or within 10% of the length of the orthogonal bisecting line 654 in the small partial field 448. In an embodiment, the IPC range is inset from the substrate edge by a width of a substrate edge exclusion zone between the substrate edge and the patternable area edge 450 ($w_{ee}$=1-3 mm) plus a safety margin of 2-3 mm. In an embodiment, the width of the ICP range may be on the order of the ICP contact area.

Figure 6D:
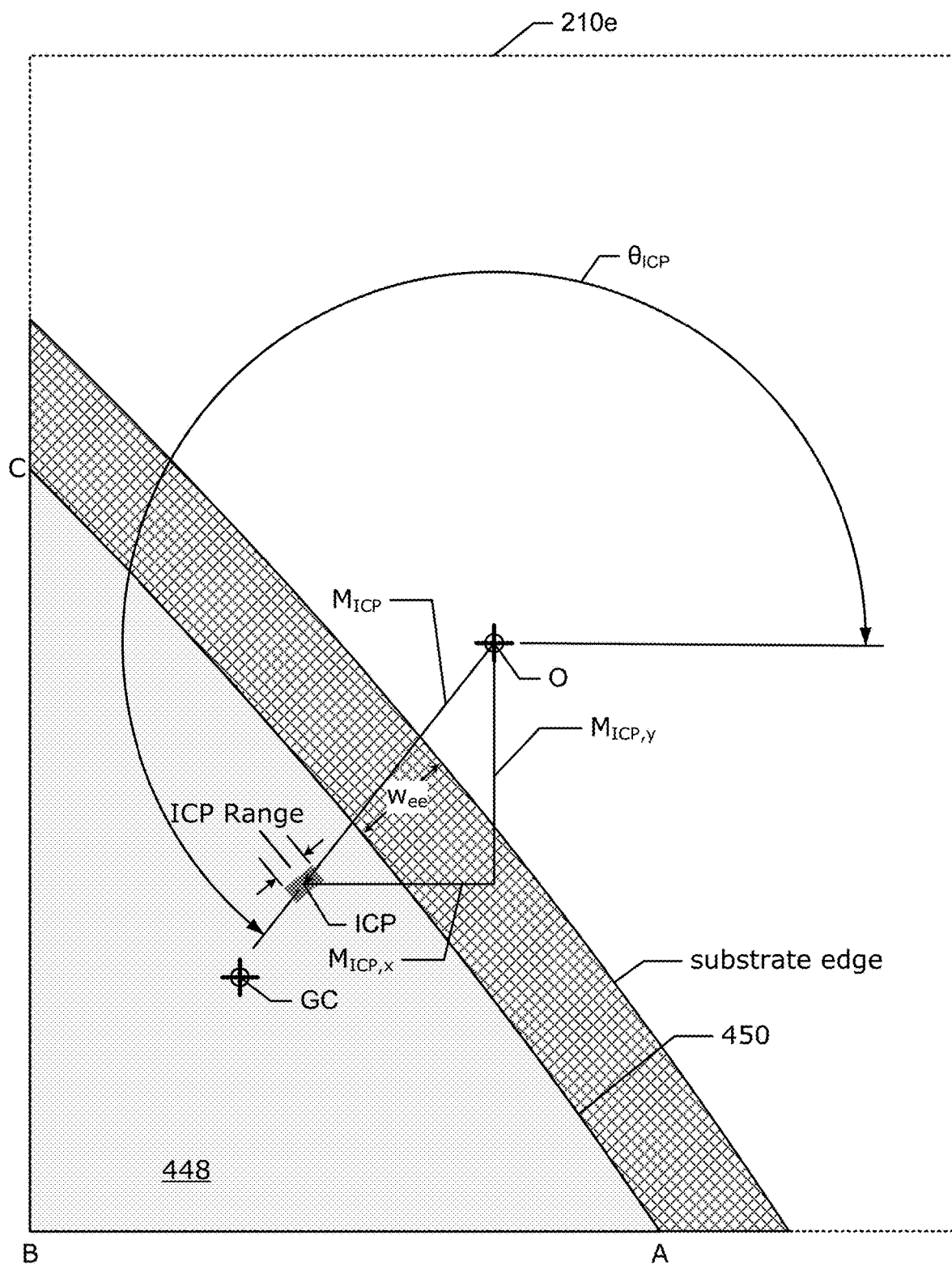

The process 500 may include an ICP determination step S522 in which the ICP offset is determined as illustrated in FIG. 6D. The ICP is on the orthogonal bisecting line 654 and is within the ICP range. The ICP may be determined relative to the origin O of the coordinate system of the mesa. The ICP offset may be described by an ICP offset angle ($\theta_{ICP}$) around a z-axis passing through a center of the mesa and an ICP offset magnitude ($M_{ICP}$). The ICP offset may also be described by two components ($M_{ICP,x}$, and $M_{ICP,y}$). The ICP offset magnitude ($M_{ICP}$) is a length of vector connecting the origin O to the ICP. The ICP offset angle ($\theta_{ICP}$) is a direction of that vector relative to the origin O in the coordinate system of the mesa.

Once the ICP is determined in the ICP determination step S522 the ICP may be used during the contacting step S304 of the shaping process 300. An alternative embodiment may include a control condition determination step S524 in which control conditions which allow the template 108 to initially contact the formable material 124 at the ICP within the ICP range are determined.

Figure 7A:
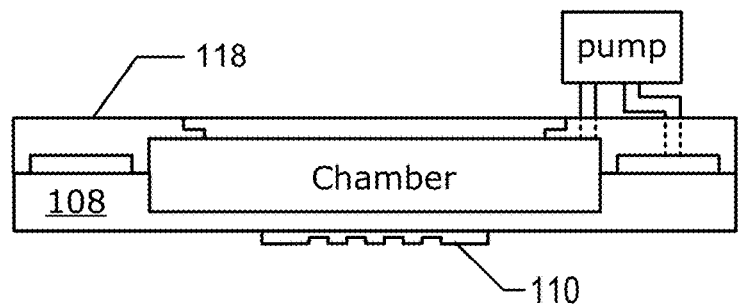
FIGS. 7A-E are illustrations of a template and substrate as used in an embodiment.
Figure 7B:
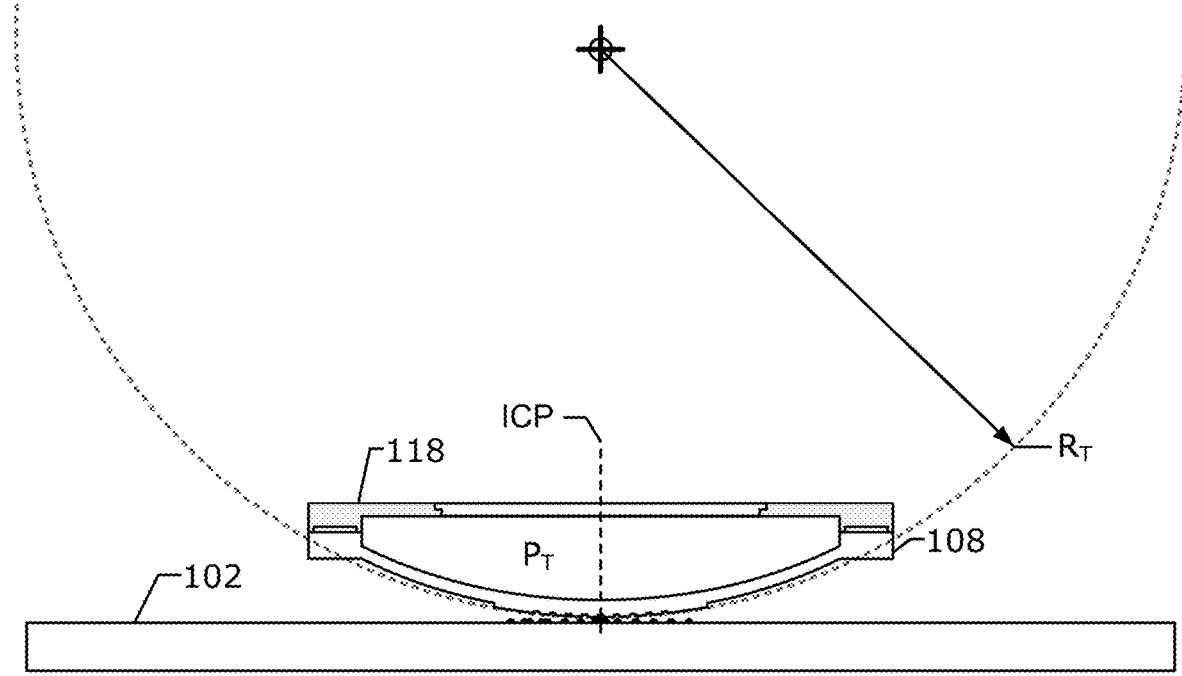

The control conditions may include a template back pressure ($P_T$) that is applied by the template chuck 118 to a back surface of the template which bows out the template 108. FIG. 7A is an illustration of a pump connected to an exemplary template chuck 108 for holding a template 108 details of which are described in US Patent Publication No. 2017/0165898-A1 which is hereby incorporated by reference in its entirety. The template chuck 118 may include one or more vacuum portions which hold the template 108 and a chamber portion which can be used to bow out template 108 as illustrated in FIG. 7B. By increasing the pressure in the chamber above the ambient pressure of the shaping surface 112, the template 108 is bowed out causing the shaping surface 112 to have a curvature that may be approximated by a radius of curvature (RT) at the ICP. The radius of curvature of the template RT is an approximate representative of a shape of the shaping surface 112 at the ICP. A polynomial (for example a fourth order polynomial) may also be used to approximate the shape of the shaping surface 112 in the region of the ICP at the time of initial contact. A finite element model or other simulation model may be used to determine a shape of the shaping surface under different control conditions.

Figure 7C:
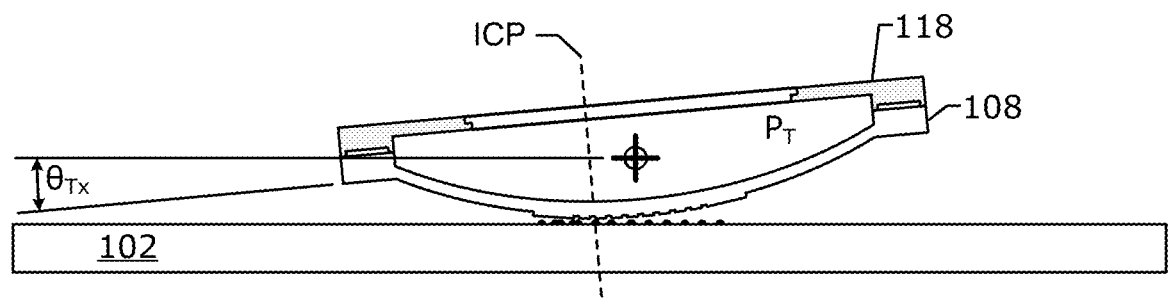

The control conditions may include a tipping angle of the template ($\theta_{Tx}$, rotation of the template about the x-axis) and a tilting angle of the template ($\theta_{Ty}$, rotation of the template about the y-axis), which together are the template control angles ($\theta_T = \{\theta_{Tx}, \theta_{Ty}\}$) relative to the substrate as illustrated in FIG. 7C. The imprint head 120 may include a plurality of actuators that are used to position the template 108 relative to the substrate 102 these plurality of actuators can also be used to tilt the shaping surface 112 relative to the substrate 102. FIG. 7C shows the tilt of a reference surface (front surface of the template chuck) relative to the substrate 102 which is at the same angle as shaping surface 112 when it is not bowed out.

Figure 7D:
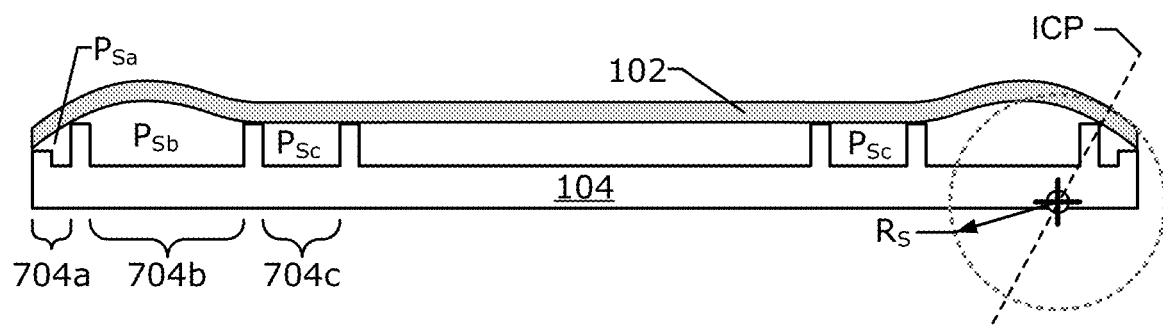

The control conditions may include a set of substrate chuck control values supplied to the substrate chuck 104. The substrate chuck 104 may deform a shape of the substrate 102. As illustrated in FIG. 7D, the substrate chuck 104 may be a zone chuck in which different zones (for example outer zone 704a, first inner zone 704b, second inner zone 704c, etc.) may be supplied with different amounts of positive or negative pressure which causes the substrate to be deformed by between 1-10 µm. For example, positive pressure may be supplied to the first inner zone 704b while negative pressures are supplied to the outer zone 704a and the second inner zone 704c. As with the template the shape of the substrate surface 130 may be approximately represented by a radius of curvature of the substrate ($R_S$) at the ICP. A polynomial (for example a fourth order polynomial) may also be used to approximate the shape of the shaping surface 112 in the region of the ICP at the time of initial contact. A finite element model or other simulation model may be used to determine a shape of the shaping surface under different control conditions.

Figure 7E:
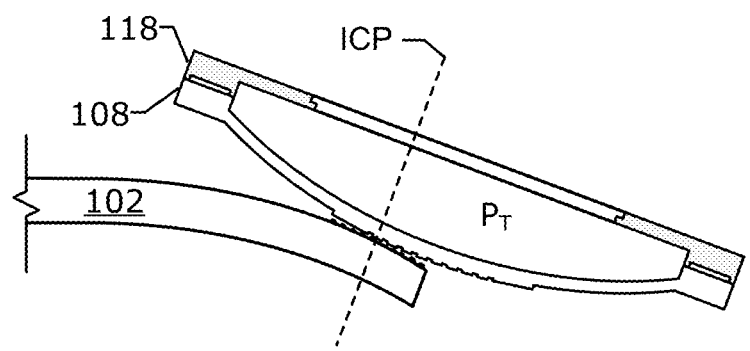

The control conditions ($R_T$, $R_S$, $\theta_T$, etc.) may be adjusted in combination to control where the ICP is on the small partial field 448 as illustrated in FIG. 7E. The control conditions may include additional parameters which describe the shapes and orientations of the shaping surface 112 at ICP and the substrate surface 130 at ICP. The control parameters may include a plurality of control values and/or trajectories (pressures, currents, voltages, binary control signals, etc.) which are used to determine the shapes and orientations of the shaping surface 112 at ICP and the substrate surface 130 at ICP.

The amount of pressure that is supplied to the chamber depends on the desired radius of curvatures ($R_T$, $R_S$) at ICP and during the filling step S306 which may be determined based on reducing non-fill defects caused by gas not escaping during the filling step S306 for a given fill time. There are limitations on the control parameters based on the mechanical characteristics of the template 108, the substrate 102, and the shaping system 100. These limitations prevent: the recessed surface 244 of the template from contacting the substrate surface 130 or an applique surrounding the substrate; and/or the shaping surface 112 from contacting the applique surrounding the substrate. In an alternative embodiment, the ICP is chosen within the ICP range based on limitations on the control parameters. These limitations may be determined experimentally, and/or using a finite element model or other simulation methods. For example, when both the template and substrate are flat the template angle can be calculated using simple trigonometry as described in equation (1) below. Once the shape of a bowed out shaping surface 112 and/or shape of bowed out substrate surface 130 are determined coordinate transformations may be used to determine the limitations.

$$\theta_T < \tan^{-1}(2h_T/w_T) \quad (1)$$

Figure 8A:
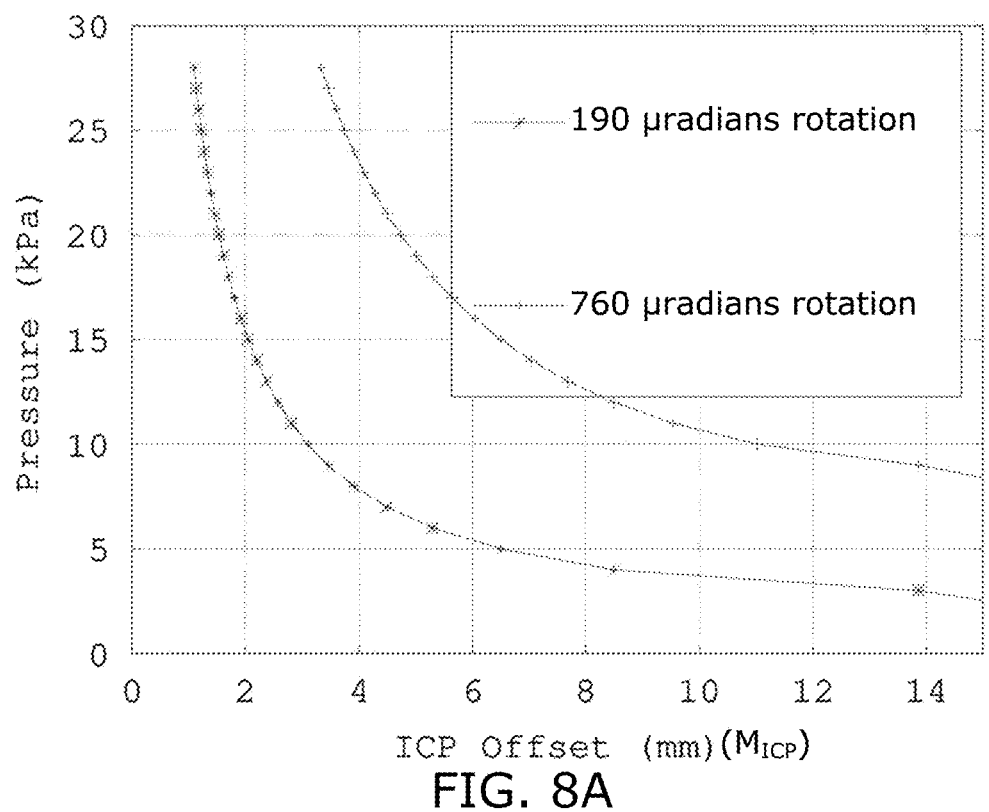
FIGS. 8A-B are charts that illustrate the relationship between an ICP offset and control parameters of the shaping system as used in an embodiment.
Figure 8B:
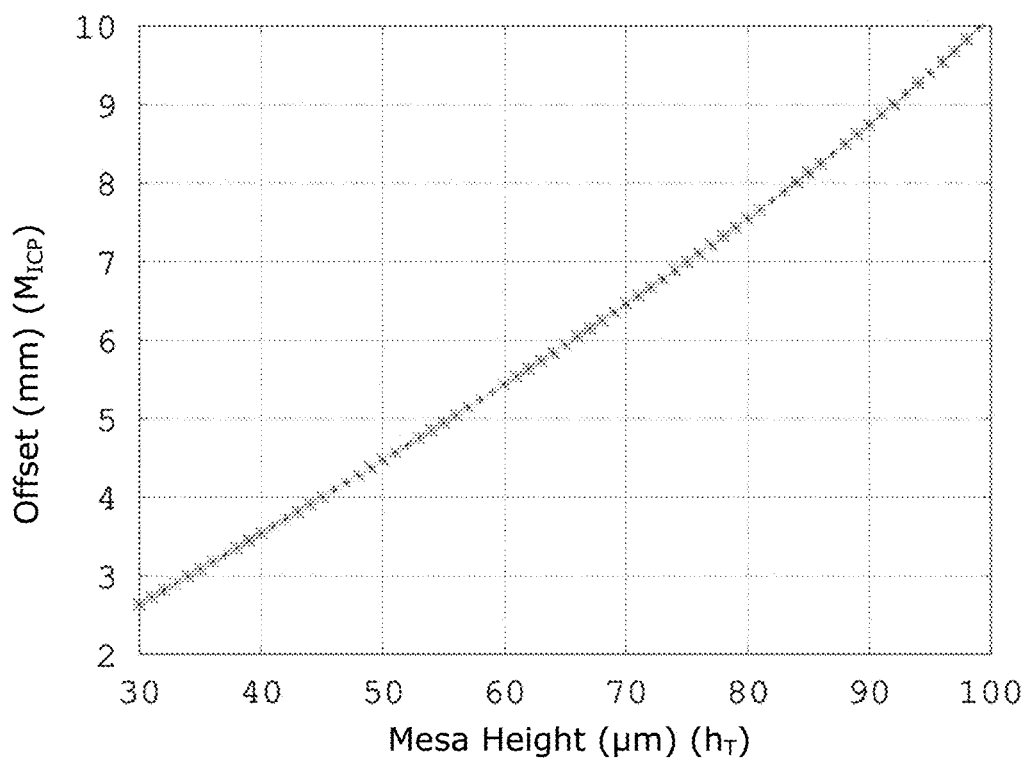

FIG. 8A is an illustration of how changes in the pressure applied to back of the template changes the ICP offset magnitude ($M_{ICP}$) for x-axis template tilts ($\theta_{Tx}$) of 0.19 milliradians and 0.76 milliradians. FIG. 8B is an illustration of how the mesa height ($h_T$) influences the ICP offset magnitude ($M_{ICP}$).

FIGS. 9A-G are timing diagrams illustrating how control conditions may vary over time before and after the initial contact time ($t_{IC}$) in an exemplary embodiment. FIG. 9A is a timing diagram illustrating how the template back pressure ($P_T$) is adjusted to an initial template bowing pressure ($P_{T1}$) prior to the initial contact time ($t_{IC}$) and then adjusted to a gas release template bowing pressure ($P_{T2}$) after the initial contact time ($t_{IC}$). The template back pressure ($P_T$) is then adjusted until the template is flat relative to the substrate.

FIGS. 9B-C are timing diagrams illustrating how the substrate back pressures ($P_{Sa}$, $P_{Sb}$, and $P_{Sc}$) are adjusted to bow out the substrate prior to the initial contact time ($t_{IC}$) and then the pressure is adjusted prior to curing step S308 so that the substrate and the template are parallel to each other during the curing step S308.

FIG. 9D is a timing diagram illustrating how the contact force that the template 108 applies to the formable material 124 may be adjusted during the shaping process 300. The contact force may increase after the initial contact time ($t_{IC}$) and then be reduced to a final imprint force prior to start of the curing step S308.

FIGS. 9E-F are timing diagrams illustrating how the template 108 and the substrate 102 are oriented relative to each other. The template control angles ($\theta_T$) may be increased prior to the initial contact time ($t_{IC}$) and are then reduced until the template and substrate are parallel with each other during the curing step S308.

FIG. 9FG is a timing diagram illustrating how the template chuck position ($z_T$) is adjusted during a part of the shaping process 300. The distance between the template chuck and the substrate is reduced until the bowed out template 108 comes into contact with the formable material 124 at the initial contact time ($t_{IC}$). The position is then adjusted as the template, and substrate, become unbowed and parallel to each other until there is a small residual layer thickness of formable material between the shaping surface 112 and the substrate surface 130 during the curing step S308.

Figure 10:
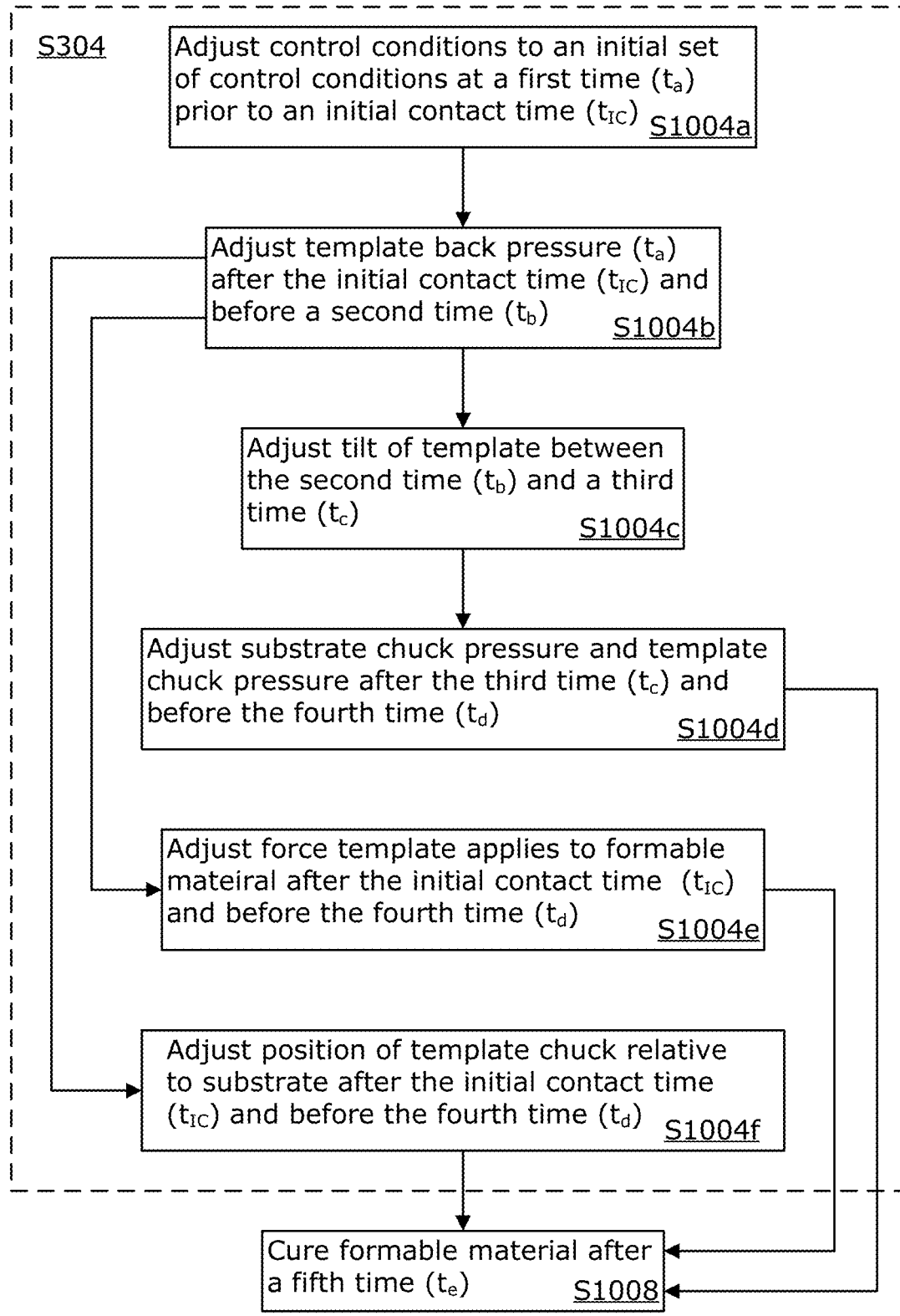
FIG. 10 is a flowchart illustrating an adjustment of the control parameters of the shaping system as used in an embodiment.

FIG. 10 is a flowchart illustrating the steps performed during the contacting step S304 for small partial fields 448 in an exemplary embodiment. The contacting step S304 may include an initial control conditions setting step S1004a in which the control conditions are adjusted to an initial set of control conditions at a first time ($t_a$) prior to an initial contact time ($t_{IC}$). The initial set of control conditions may include: a template back pressure ($P_T$) to an ICP template back pressure; the tip and tilt of the template ($\theta_T$); first inner ring substrate pressure ($P_{Sb}$); outer ring substrate pressure ($P_{Sa}$); second inner ring substrate pressure ($P_{Sc}$); the template chuck position ($z_T$); etc. The tilts, the template chuck position ($z_T$), and pressures should be adjusted to the values which controls the ICP at the initial contact time ($t_{IC}$) which may be determined using data such that illustrated in FIGS. 8A-B.

After the first time ($t_a$) the template chuck position is adjusted until the shaping surface 112 is brought into contact with the formable material 124 at the ICP at the initial contact time ($t_{IC}$). After the initial contact time ($t_{IC}$) and before a second time ($t_b$), the template chuck 118 may adjust the template back pressure ($t_a$) from an ICP template back pressure to a gas escape template back pressure in a back pressure adjustment step S1004b. The gas escape template back pressure may be greater than the ICP template back pressure. The ICP template back pressure is chosen to ensure that initial contact happens correctly while the gas escape template back pressure is chosen to ensure that gas can escape as droplets of formable material spread underneath template as more of the template is brought into contact with the formable material.

Between the second time ($t_b$) and a third time ($t_c$), the tip and tilt of template is adjusted in a tilt adjustment step S1004c until the template chuck is substantially parallel to the substrate chuck. After the tilt is adjusted, in a pressure adjustment step S1004d the substrate chuck pressure and template chuck pressure are adjusted after the third time ($t_c$) and before the fourth time ($t_d$) until both the template and the substrate are no longer bowed out. In an alternative embodiment, the pressure adjustment step S1004d is performed at the same time as the tilt adjustment step S1004c. In another alternative embodiment, the pressure adjustment step S1004d is performed before the tilt adjustment step S1004c.

At the initial contact time ($t_{IC}$) and before the fourth time ($t_d$), during a force adjustment step S1004e, the force that the shaping surface 112 applies to the formable material is adjusted until a final force is reached that will be applied during the curing step S308 as illustrated in FIG. 9D. After the initial contact time ($t_{tC}$) and before the fourth time ($t_d$), during a template position adjustment step S1004f the position of the template chuck ($z_T$) is adjusted relative to the substrate chuck until there is a set residual layer thickness of formable material between the shaping surface and the substrate surface.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
   receiving information about: a partial field of a substrate; and an edge of a patternable area of the substrate;
   determining of an initial contact point includes determining a chord that connects intersection vertices of the partial field and the edge;
   the determining of the initial contact point includes determining coordinates of a bisecting line, wherein the bisecting line bisects the chord, and the bisecting line is orthogonal to the chord;
   the determining of the initial contact point includes determining an initial contact point range on the bisecting line in which a template and formable material on the substrate contact each other; and
   initially contacting the formable material in the partial field on the substrate with the template at the initial contact point within the initial contact point range.

2. The method of claim 1, wherein an area of the partial field is less than 30% of a full field area of the substrate.

3. The method of claim 1, further comprising determining control conditions which allow the template to initially contact the formable material at the initial contact point.

4. The method of claim 3, wherein the control conditions include a pressure applied to a back surface of the template which bows out the template during the initially contacting of the formable material in the partial field on the substrate with the template.

5. The method of claim 3, wherein the control conditions include a tilt of the template relative to the substrate during the initially contacting of the formable material in the partial field on the substrate with the template.

6. The method of claim 3, wherein the control conditions during the initially contacting of the formable material in the partial field with the template include a set of control values supplied to a substrate chuck; wherein the substrate chuck deforms a shape of the substrate.

7. The method of claim 1, wherein the edge of the patternable area is inset from a substrate edge.

8. The method of claim 1, wherein the substrate is divided into a plurality of fields including a plurality of full fields and a plurality of partial fields, wherein the plurality of partial fields fall into multiple partial field categories, further comprising:
   determining the initial contact point for a particular partial field among the plurality of partial fields is based on the partial field category.

9. The method of claim 8, wherein the partial field category is based on a shape of the partial field.

10. A method of shaping a film on a substrate in a plurality of fields, wherein a subset of fields among the plurality of fields that are categorized as the partial field are shaped using the method of claim 1, wherein the method further comprises:
    adjusting, after the initial contact, the control conditions so that the template contacts all of the formable material in the particular field with the template;
    exposing the formable material under the template to actinic radiation after the template and the substrate are substantially parallel to each other;
    separating the template from the formable material.

11. A method of manufacturing an article, from a substrate on which a film was shaped according to the method of claim 10, further comprising:
    processing the substrate; and
    forming the article from the processed substrate.

12. The method of claim 10, further comprising increasing a template back pressure that a template chuck uses to bow out the template after the initial contact.

13. The method of claim 1, wherein the information received includes a layout of a plurality of fields.

14. A system comprising:
    one or more memory; and
    one or more processors configured to:
       receive information about: a template; a partial field of a substrate; and an edge of a patternable area of the substrate;
       determine an initial contact point that includes determining a chord that connects intersection vertices of the partial field and the edge;
       determine an initial contact point that includes determining coordinates of a bisecting line, wherein the bisecting line bisects the chord, and the bisecting line is orthogonal to the chord;
       determine an initial contact point that includes determining an initial contact point range on the bisecting line in which a template and formable material on the substrate contact each other; and
       send instructions for a shaping system to contact the formable material in the partial field on the substrate with the template at the initial contact point within the initial contact point range.

15. The system of claim 14, wherein the processor is further configured to determine control conditions which allow the template to initially contact the formable material at the initial contact point.

16. The system of claim 15, further comprising:
    a template chuck configured to apply a pressure to a back surface of the template which bows out the template; and
    wherein the control conditions include the pressure applied during the initial contact of the formable material in the partial field with the template.

17. The system of claim 15, further comprising:
    a plurality of actuators configured to adjust a tilt of the template relative to the substrate; and
    wherein the control conditions during the initial contact of the formable material in the partial field with the template includes the tilt.

18. The system of claim 15, further comprising:
    a substrate chuck configured to deform a shape of the substrate; and
    wherein the control conditions during the initial contact of the formable material in the partial field with the template include a set of control values supplied to the substrate chuck.

19. The system of claim 14, wherein the substrate is divided into a plurality of fields including a plurality of full fields and a plurality of partial fields, wherein the plurality of partial fields fall into multiple partial field categories, wherein the processor is further configured to:
- determine the initial contact point for a particular partial field among the plurality of partial fields based on the partial field category.

20. The system of claim 19, wherein the partial field category is based on a shape of the partial field.

* * * * *